(12) United States Patent
Li et al.

(10) Patent No.: US 10,393,810 B2
(45) Date of Patent: Aug. 27, 2019

(54) METHOD FOR IDENTIFYING THE FAULT BY CURRENT DIFFERENTIAL PROTECTION AND DEVICE THEREOF

(75) Inventors: Youyi Li, Beijing (CN); Kai Liu, Beijing (CN); Bin Su, Beijing (CN)

(73) Assignee: ABB Schweiz AG, Baden (CH)

( * ) Notice: Subject to any disclaimer, the term of this patent is extended or adjusted under 35 U.S.C. 154(b) by 1116 days.

(21) Appl. No.: 14/405,292

(22) PCT Filed: Jun. 6, 2012

(86) PCT No.: PCT/CN2012/076525
§ 371 (c)(1),
(2), (4) Date: Feb. 6, 2015

(87) PCT Pub. No.: WO2013/181809
PCT Pub. Date: Dec. 12, 2013

(65) Prior Publication Data
US 2015/0160297 A1 Jun. 11, 2015

(51) Int. Cl.
*G01R 31/327* (2006.01)
*H02H 3/28* (2006.01)

(52) U.S. Cl.
CPC ........... *G01R 31/3278* (2013.01); *H02H 3/28* (2013.01); *H02H 3/283* (2013.01)

(58) Field of Classification Search
None
See application file for complete search history.

(56) References Cited

U.S. PATENT DOCUMENTS 3,679,937 A * 7/1972 Ulyanitsky ............ H02H 3/265
361/67
4,502,086 A * 2/1985 Ebisaka ................. H02H 3/283
361/36
(Continued)

FOREIGN PATENT DOCUMENTS

CN 1233099 A 10/1999
CN 1773799 A 5/2006
(Continued)

OTHER PUBLICATIONS

ISA/CN International Search Report dated Mar. 14, 2013 re PCT Application No. PCT/CN2012/076525, filed Jun. 6, 2012.
(Continued)

*Primary Examiner* — Gregory J Toatley, Jr.
*Assistant Examiner* — Brandon J Becker
(74) *Attorney, Agent, or Firm* — J. Bruce Schelkopf; Taft Stettinius & Hollister LLP (57) ABSTRACT

The present invention discloses a method for identifying the fault by current differential protection and a device thereof. The method comprises: measuring the full component currents of the two terminals of a two-terminal line system and calculating the corresponding fault component current vectors; obtaining an operate value by calculating a first difference between an absolute value of the sum of the fault component current vectors and $I_{set1}$; obtaining a restrain value by multiplying a second difference with a control factor, in which the second difference is calculated between the maximum of the absolute values of the fault component currents and $I_{set2}$ or between the absolute value of the difference of said fault component currents and $I_{set2}$; and identifying a fault as an external one or internal one by comparing the operate value with the restrain value. The
(Continued)

solutions of the present invention achieve better reliability, sensitivity and faster speed than existing products.

14 Claims, 4 Drawing Sheets

(56) References Cited

U.S. PATENT DOCUMENTS

| | | | | |
|---|---|---|---|---|
| 4,670,811 | A * | 6/1987 | Eda | H02H 7/22 361/45 |
| 4,825,326 | A * | 4/1989 | Andow | H02H 3/283 361/63 |
| 5,095,399 | A * | 3/1992 | Terada | H02H 3/28 361/44 |
| 5,963,404 | A * | 10/1999 | Guzman-Casillas | H02H 7/045 361/115 |
| 6,341,055 | B1 * | 1/2002 | Guzman-Casillas | H02H 3/283 361/115 |
| 6,442,010 | B1 * | 8/2002 | Kasztenny | H02H 3/283 361/63 |
| 6,442,011 | B1 | 8/2002 | Attarian et al. | |
| 6,829,544 | B1 * | 12/2004 | Kasztenny | H02H 7/22 361/80 |
| 2002/0018327 | A1 * | 2/2002 | Walker | H01F 6/06 361/58 |
| 2002/0101229 | A1 | 8/2002 | Roberts | |
| 2008/0130179 | A1 * | 6/2008 | Gajic | H02H 7/045 361/36 |
| 2009/0009181 | A1 * | 1/2009 | Gangadharan | H02H 3/286 324/522 |
| 2009/0242372 | A1 * | 10/2009 | Weber | H01H 71/1009 200/400 |
| 2010/0264749 | A1 * | 10/2010 | Guzman-Casillas | H02J 3/01 307/105 |
| 2012/0105077 | A1 * | 5/2012 | Geneste | G01D 18/00 324/604 |

FOREIGN PATENT DOCUMENTS

| | | |
|---|---|---|
| CN | 102104242 A | 6/2011 |
| JP | 2006-14400 A | 1/2006 |
| KR | 2012-0018725 A | 3/2012 |

OTHER PUBLICATIONS

The Patent Office of the P.R. of China, First Office Action and Patent Search Report for corresponding Chinese application No. 201280073738.X, dated Apr. 27, 2016, 10 pages, including English translations.

European Patent Office, Supplementary European Search Report for corresponding EP application No. 1287842.1, dated Mar. 4, 2016, 7 pages.

Indian Patent Office, Examination Report for corresponding IN application No. 7916/CHENP/2014, dated Jun. 29, 2018, 5 pages.

Response to Extended European Search Report for corresponding EP application No. 1287842.1, dated Sep. 21, 2016, 21 pages.

* cited by examiner

METHOD FOR IDENTIFYING THE FAULT BY CURRENT DIFFERENTIAL PROTECTION AND DEVICE THEREOF

FIELD OF THE INVENTION

The invention relates to the current differential protection technical field, and more particularly to a method for identifying the fault by current differential protection and a device thereof.

BACKGROUND OF THE INVENTION

At present, current differential protection is widely used by power system as the main protection due to its good performance. The identifying criterion of a classical current differential protection is shown below:

$$\begin{cases} |\dot{I}_M + \dot{I}_N| > k \cdot |\dot{I}_M - \dot{I}_N| \\ |\dot{I}_M + \dot{I}_N| > I_{d\,min} \end{cases} \quad (1)$$

Such criterion is based on full component currents, which are the original measured currents including load current and fault component current based on superposition principle; however the solution also shows the following problems:
1) Low sensitivity and slow operation speed for heavy load conditions or high resistance faults;
2) Possible mal-trip for external fault with CT saturation;
3) Difficult to balance sensitivity, speed and reliability. Low threshold for good sensitivity and speed, the reliability will be worse. High threshold for good reliability, the sensitivity and speed will be worse.

To resolve these problems, fault component based differential protection was proposed by researchers and manufactures. The algorithm of a typical fault component based differential protection is shown as below:

$$\begin{cases} |\Delta \dot{I}_M + \Delta \dot{I}_N| > k \times |\Delta \dot{I}_M - \Delta \dot{I}_N| \\ |\Delta \dot{I}_M + \Delta \dot{I}_N| > I_{d\,min} \end{cases} \quad (2)$$

It can be seen that such solution will have better sensitivity and speed than the classical current differential relay under the conditions of heavy load and high resistance fault generally, because the load currents are removed from the calculation. But existing fault component differential protection only improves the sensitivity and speed in some sense, it doesn't solve the reliability problem of CT saturation; moreover no effective solution which achieves good balance between sensitivity and reliability.

Similar to classical full component based differential protection; the classical fault component based current differential protection may mal-trip due to the external fault with CT saturation. In addition, both the two differential protections are difficult to achieve good balance between sensitivity, speed and reliability. If the sensitivity and speed are improved for identifying internal fault, it will reduce the reliability of identifying external fault. On the other hand, if the reliability of identifying external fault is improved, it will reduce the sensitivity and speed for identifying internal fault.

Consequently, existing solutions mentioned above are difficult to ensure both sensitivity and reliability of the differential protection as well as speed simultaneously. Due to the above mentioned problems, the present invention is to propose a method for identifying the fault by current differential protection and a device thereof.

SUMMARY OF THE INVENTION

The main object of the present invention is to improve the current differential protection's sensitivity and speed for internal fault and reliability for external fault. Hence, the present invention provides a method for identifying the fault by current differential protection and a device thereof.

According to an aspect of the present invention, it provides a method for identifying the fault by current differential protection. The method comprises: measuring the full component currents of the two terminals of a two-terminal line system and calculating the corresponding fault component current vectors; obtaining an operate value by calculating a first difference between an absolute value of the sum of the fault component current vectors and a first preset value $I_{set1}$; obtaining a restrain value by multiplying a second difference with a control factor, in which the second difference is calculated between the maximum of the absolute values of the fault component currents and a second preset value $I_{set2}$ or between the absolute value of the difference of the fault component currents and a second preset value $I_{set2}$; and identifying a fault as an external one or internal one by comparing the operate value with the restrain value.

According to another preferred embodiment of the present invention, the control factor relates to the phase angle of the fault component currents.

According to another preferred embodiment of the present invention, the control factor will be a relatively big positive value for an external fault and a relatively small positive value or negative value for an internal fault.

According to another preferred embodiment of the present invention, if operate value is smaller than the restrain value, a fault is identified as an external fault or no fault occurs in the system; otherwise, an internal fault will be identified.

According to another preferred embodiment of the present invention, the method can be applied to a multi-terminal system by converting the multi-terminal system into a virtual two-terminal system.

According to another preferred embodiment of the present invention, the method further comprises: measuring the full component currents of all terminals of a multi-terminal line system and calculating the corresponding fault component current vectors; selecting the maximum from the calculated fault component currents; calculating the sum of all the other calculated fault component currents except the maximum; and deeming the maximum and the sum as two terminals' currents of the virtual two-terminal system.

According to another preferred embodiment of the present invention, the method directly uses the full component current vectors corresponding to the fault component current vectors for identifying the fault.

According to the other aspect of the present invention, it provides a device for identifying the fault by current differential protection. The device comprises: a measurement module, configured to measure the full component currents of the two terminals of a two-terminal line system; a calculating module, configured to calculate the corresponding fault component current vectors; obtaining an operate value by calculating a first difference between an absolute value of the sum of the fault component current vectors and a first preset value $I_{set1}$; obtaining a restrain value by multiplying a second difference with a control factor, in which the second difference is calculated between the maximum of the absolute values of the fault component currents and a second preset value $I_{set2}$ or between the absolute value of the difference of the fault component currents and a second preset value $I_{set2}$; and an identifying module, configured to identify a fault as an external one or internal one by comparing the operate value with the restrain value.

According to another preferred embodiment of the present invention, the control factor relates to the phase angle of the fault component currents.

According to another preferred embodiment of the present invention, the control factor will be a relatively big positive value for an external fault and a relatively small positive value or negative value for an internal fault.

According to another preferred embodiment of the present invention, the identifying module identifies a fault as an external fault or no fault in the system if operate value is smaller than the restrain value; otherwise, an internal fault.

According to another preferred embodiment of the present invention, the device can be applied to a multi-terminal system by converting the multi-terminal system into a virtual two-terminal system.

According to another preferred embodiment of the present invention, the measurement module is further configured to measure the full component currents of all terminals of a multi-terminal line system and calculating the corresponding fault component current vectors; the calculating module is further configured to select the maximum from the calculated fault component currents, and calculate the sum of all the other calculated fault component currents except the maximum; and a converting module is configured to deem the maximum and the sum as two terminals' currents of the virtual two-terminal system.

According to another preferred embodiment of the present invention, the device directly uses the full component current vectors corresponding to the fault component current vectors for identifying the fault.

Embodiments of the present invention provide a method for identifying the fault by current differential protection and a device thereof, which achieves better reliability, sensitivity and operation speed than existing current differential protections.

BRIEF DESCRIPTION OF THE DRAWINGS

The subject matter of the invention will be explained in more details in the following description with reference to preferred exemplary embodiments which are illustrated in the drawings, in which:

FIG. 1 illustrates a typical two-terminal power system with an internal fault (FIG. 1a) and the corresponding fault component network (FIG. 1b);

DETAILED DESCRIPTION OF PREFERRED EMBODIMENTS

Exemplary embodiments of the present invention are described in conjunction with the accompanying drawings hereinafter. For the sake of clarity and conciseness, not all the features of actual implementations are described in the specification.

The proposed invention is for the current differential protection, and the difference of phase angles ($arg(\Delta I_{Remote})$, $arg(\Delta I_{Local})$) of fault component currents from differential terminals are different for an internal fault or external fault. The phase difference is almost 0 degree for an internal fault and almost 180 degree for an external fault. Such obvious difference can be used to set the restrain values or operate values to make the operating property widely adaptive. In this way, the operation scope can be changeable according to the fault conditions, and will be very small for an external fault and very large for an internal fault. Thereby, better sensitivity for internal fault and better reliability for external fault can be achieved at the same time.

Figure 1A:
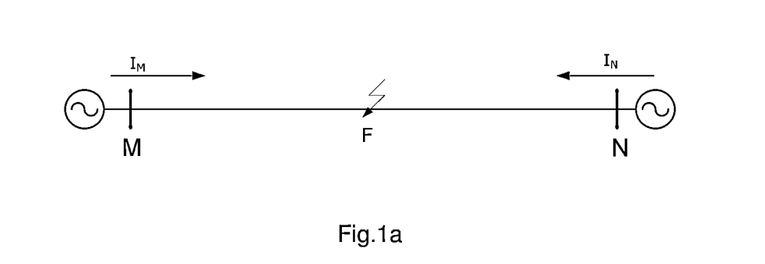
Figure 1B:
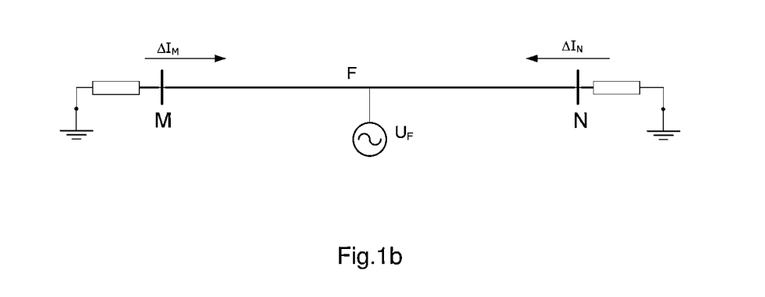

FIG. 1a illustrates a typical two-terminal power system with an internal fault, and FIG. 1b illustrates the fault component network of FIG. 1a.

As shown in FIG. 1a, $\dot{I}_M$ and $\dot{I}_N$ are the measured currents by the differential protection at the two terminals M and N. And $\Delta \dot{I}_M$ and $\Delta \dot{I}_N$ are the corresponding fault component currents of the two terminals.

Figure 2:
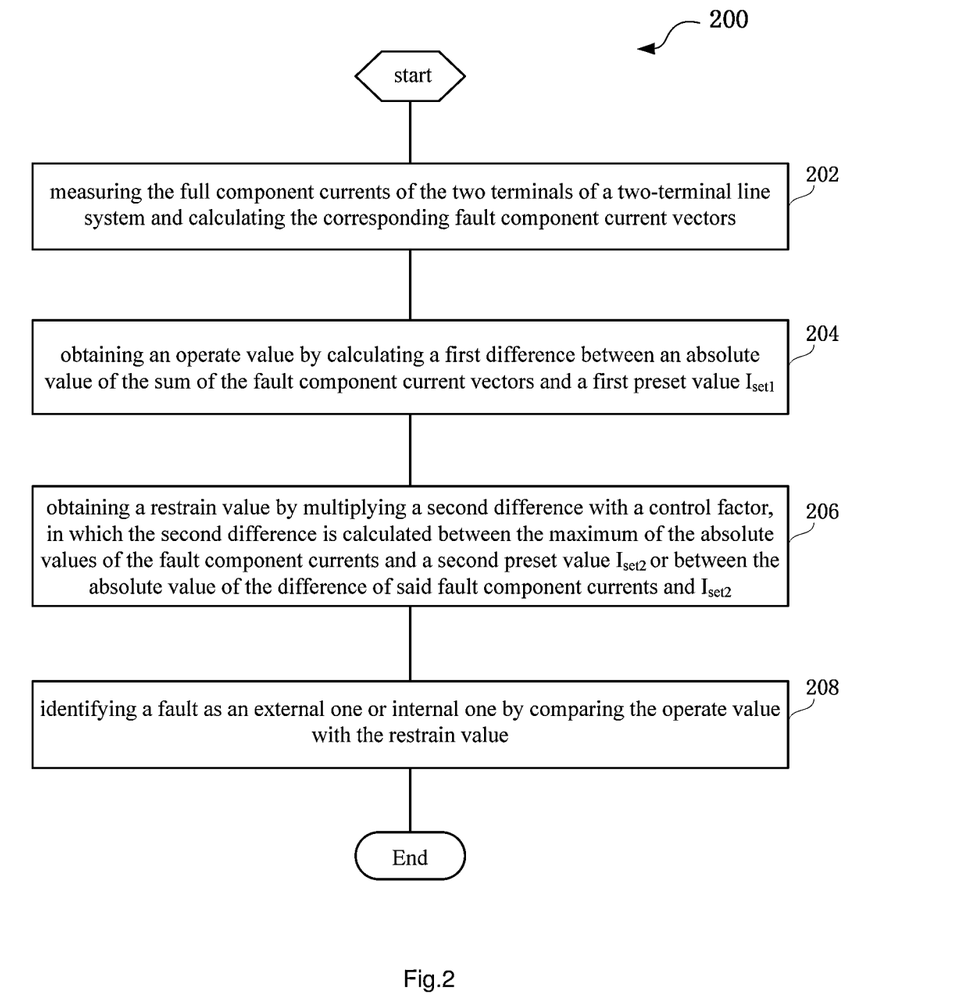
FIG. 2 illustrates a flow chart of the method for identifying the fault by current differential protection according to the present invention.

FIG. 2 illustrates a flow chart of the method for identifying the fault by current differential protection according to the present invention.

As shown in FIG. 2, the method 200 for identifying the fault by current differential protection comprises:

Step 202, measuring the full component currents of the two terminals of a two-terminal line system and calculating the corresponding fault component current vectors. In FIG. 1b, $\Delta \dot{I}_M$ and $\Delta \dot{I}_N$ can be calculated from full component currents $\dot{I}_M$ and $\dot{I}_N$. It's preferred that the fault component current includes at least one of fault component phase current, fault positive sequence current, negative sequence current and zero sequence current.

If both $|\Delta \dot{I}_M|$ and $|\Delta \dot{I}_N|$ are larger than a threshold $I_{lim}$ which is used to ensure the calculation accuracy of current phase angle, continue operating the following steps:

Step 204, obtaining an operate value $|\Delta \dot{I}_M + \Delta \dot{I}_N| - I_{set1}$ by calculating a first difference between an absolute value of the sum of the fault component current vectors and a first preset value $I_{set1}$.

Step 206, obtaining a restrain value by multiplying a second difference with a control factor $F(\theta_M, \theta_N)$, in which the second difference $\max(|\Delta \dot{I}_M|, |\Delta \dot{I}_N|) - I_{set2}$ is calculated between the maximum of the absolute values of the fault component currents and a second preset value $I_{set2}$, $\theta_M = arg(\Delta \dot{I}_M)$ and $\theta_N = arg(\Delta \dot{I}_N)$.

Step 208, identifying a fault as an external one or internal one by comparing the operate value with the restrain value.

As to $|\Delta \dot{I}_M + \Delta \dot{I}_N| - I_{set1} \geq F(\theta_M, \theta_N) \cdot (\max(|\Delta \dot{I}_M|, |\Delta \dot{I}_N|) - I_{set2})$, if the inequality is right, an internal fault can be identified, and then the relay will be tripped; otherwise an external fault will be identified or no fault occurs in the system, and the differential current relay will not be mal-tripped.

In another embodiment, the second difference $|\Delta \dot{I}_M - \Delta \dot{I}_N| - I_{set2}$ is calculated between the absolute value of the difference of the fault component currents and a second preset value $I_{set2}$. So the inequality will be rewritten as below: $|\Delta\dot{I}_M+\Delta\dot{I}_N|-I_{set1} \geq F(\theta_M,\theta_N)\,(|\Delta\dot{I}_M-\Delta\dot{I}_N|-I_{set2})$.

The values $I_{set1}$ and $I_{set2}$ are the current settings for controlling the origin of the slope in operate characteristic. In an embodiment of the present invention, the two setting values can be set as below: $I_{set1} \geq 0$, $I_{set2} \leq 0$. It shall be noted that the values $I_{set1}$ and $I_{set2}$ can be preset as any values by the person skilled in the art according to the actual implementation.

Figure 3A:
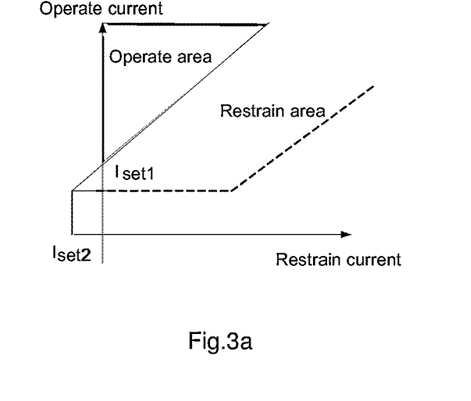
FIGS. 3a and 3b illustrates operate characteristic of the differential relay for external fault and internal fault respectively.
Figure 3B:
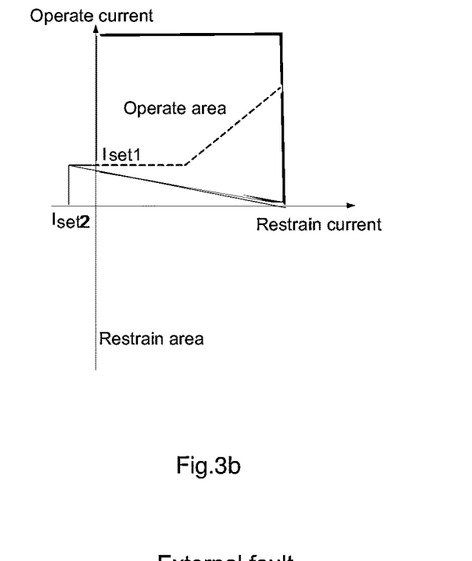

FIGS. 3a and 3b illustrates operate characteristic of the differential relay for external fault and internal fault respectively.

As shown in FIGS. 3a and 3b, the limitation makes the origin $(I_{set2}, I_{set1})$ of the operate slope is located in the second quadrant, and the dashed shows the typical operate characteristic of classical differential relay for contrast.

In which, $|\Delta\dot{I}_M+\Delta\dot{I}_N|$ represents the operate current, and $\max(|\Delta\dot{I}_M|,|\Delta\dot{I}_N|)$ represents the restrain current. $F(\theta_M,\theta_N)$ is a general function of the fault component current phases, which should be a negative value or relatively small positive value for internal fault and relatively big positive value for external fault. By this means, it controls the slope ratio in operate characteristic. Therefore, it will reduce the operate area for external fault and enlarge the operate area for internal fault.

In a preferred embodiment of the present invention, the control factor $F(\theta_M,\theta_N)$ can be $K_1-K_2\cdot\cos(\theta_M-\theta_N)$. It shall be noted that besides the example, any possible function which can meet the requirement of $F(\theta_M,\theta_N)$ mentioned above can be used for actual implementation.

Figure 4A:
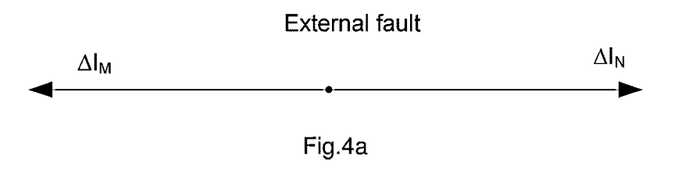
FIGS. 4a and 4b illustrate the vector diagrams of fault component current in case of an external fault and an internal fault respectively.
Figure 4B:
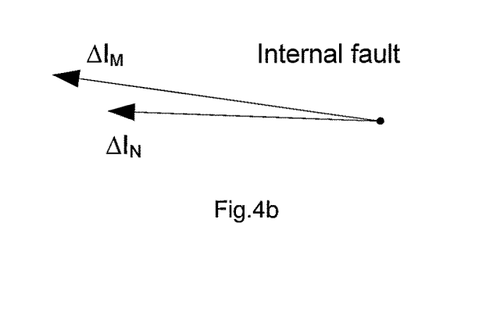

FIGS. 4a and 4b illustrate the vector diagrams of fault component current in case of an external fault and an internal fault respectively.

As above mentioned, the slope ratio is controlled by $F(\theta_M,\theta_N)$, for instance $(K_1-K_2\cdot\cos(\theta_M-\theta_N))$. Generally, $(\theta_M-\theta_N)$ is almost 0° for an internal fault shown in FIG. 4b and almost 180° for an external fault shown in FIG. 4a.

The slope ratio of $(K_1-K_2\cdot\cos(\theta_M-\theta_N))$ for operate characteristic will be a negative value or relatively small positive value for internal fault with proper setting of K1 and K2, while it will be a relatively big positive value for internal fault with proper setting of K1 and K2. Here, K1 can ensure $(K_1-K_2\cdot\cos(\theta_M-\theta_N))$ is a big enough positive value even during serious CT saturation in external fault cases (in this case, $(\theta_M-\theta_N)$ may be a big angle instead of zero). And K2 controls both the sensitivity for internal fault and reliability for external fault at the same time. In other words, a bigger K2 will benefit reliability for external fault and sensitivity for internal fault at the same time.

Figure 5:
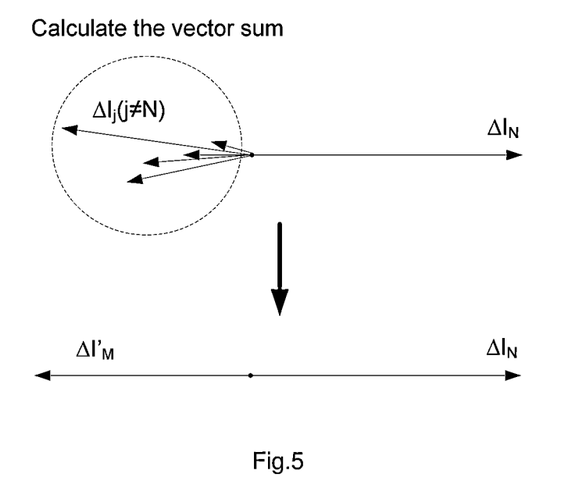
FIG. 5 illustrates the vector diagrams for converting multi-terminal system into a virtual two-terminal system according to the present invention.

FIG. 5 illustrates a vector diagram for converting multi-terminal system into a virtual two-terminal system according to the present invention.

As shown in FIG. 5, for converting multi-terminal system into a virtual two-terminal system, firstly measure the full component currents of all terminals of a multi-terminal line system and calculating the corresponding fault component current vectors. Select the maximum from the calculated fault component currents, calculate the sum of all the other calculated fault component currents except the maximum; and then deem the maximum and the sum as two terminals' currents of a virtual two-terminal system.

After a multi-terminal system is converted into a virtual two-terminal system, the method mentioned in FIG. 1 can be applied for identifying the fault by current differential protection.

According to a preferred embodiment, if at least one of current amplitude is too small to measure phase angle, for example, $|\dot{I}_M|<I_{lim}$ and/or $|\dot{I}_N|<I_{lim}$; a fixed control factor K can be used to replace the adaptive factor $F(\theta_M,\theta_N)$; that's to say, the criterion will be remodified as $|\Delta\dot{I}_M+\Delta\dot{I}_N|-I_{set1} \geq K\cdot(\max(|\Delta\dot{I}_M|,|\Delta\dot{I}_N|)-I_{set2})$. In another embodiment, the second difference $|\Delta\dot{I}_M-\Delta\dot{I}_N|I_{set2}$ is calculated between the absolute value of the difference of the fault component currents and a second preset value $I_{set2}$. So the inequality will be rewritten as below:

$$|\Delta\dot{I}_M+\Delta\dot{I}_N|-I_{set1} \geq K\cdot(|\Delta\dot{I}_M-\Delta\dot{I}_N|-I_{set2}).$$

According to the description of the present invention, it's obvious to the person skilled in the art that wherein the method directly uses the full component current vectors corresponding to the fault component current vectors for identifying the fault.

In detail, the method comprises: measuring the full component currents of the two terminals of a two-terminal line system, i.e. $\dot{I}_M$ and $\dot{I}_N$; obtaining an operate value $|\dot{I}_M+\dot{I}_N|-I_{set1}$ by calculating a first difference between an absolute value of the sum of the full component current vectors and a first preset value $I_{set1}$; obtaining a restrain value by multiplying a second difference with a control factor $F(\theta_M,\theta_N)$, in which the second difference is calculated between the maximum of the absolute values of the full component currents and a second preset value $I_{set2}$; and identifying a fault as an external one or internal one by comparing the operate value with the restrain value. That's to say, the judgment criterion is rewritten as the following:

$$|\dot{I}_M+\dot{I}_N|-I_{set1} \geq F(\theta_M,\theta_N)\cdot(\max(|\dot{I}_M|,|\dot{I}_N|)-I_{set2})$$

In another embodiment, the second difference $|\dot{I}_M-\dot{I}_N|-I_{set2}$ is calculated between the absolute value of the difference of the fault component currents and a second preset value $I_{set2}$. So the inequality will be rewritten as below:

$$|\dot{I}_M+\dot{I}_N|-I_{set1} \geq F(\theta_M,\theta_N)\cdot(|\dot{I}_M-\dot{I}_N|I-_{set2}).$$

It shall be noted that the full component current includes full component phase current and/or positive sequence phase current. In this case, the control factor $F(\theta_M,\theta_N)$ relates to the phase angle of the full component currents.

According to another embodiment of the present invention, if at least one of current amplitude is too small to measure phase angle, a fixed control factor K can be used to replace the factor $F(\theta_M,\theta_N)$, that's to say, the criterion will be remodified as $|\dot{I}_M+\dot{I}_N|-I_{set1} \geq K\cdot(\max(|\dot{I}_M|,|\dot{I}_N|)-I_{set2})$. In another embodiment, the second difference $|\dot{I}_M-\dot{I}_N|-I_{set2}$ is calculated between the absolute value of the difference of the fault component currents and a second preset value $I_{set2}$. So the inequality will be rewritten as below:

$$|\dot{I}_M+\dot{I}_N|-I_{set1} \geq K\cdot(|\dot{I}_M-\dot{I}_N|-I_{set2}).$$

Figure 6:
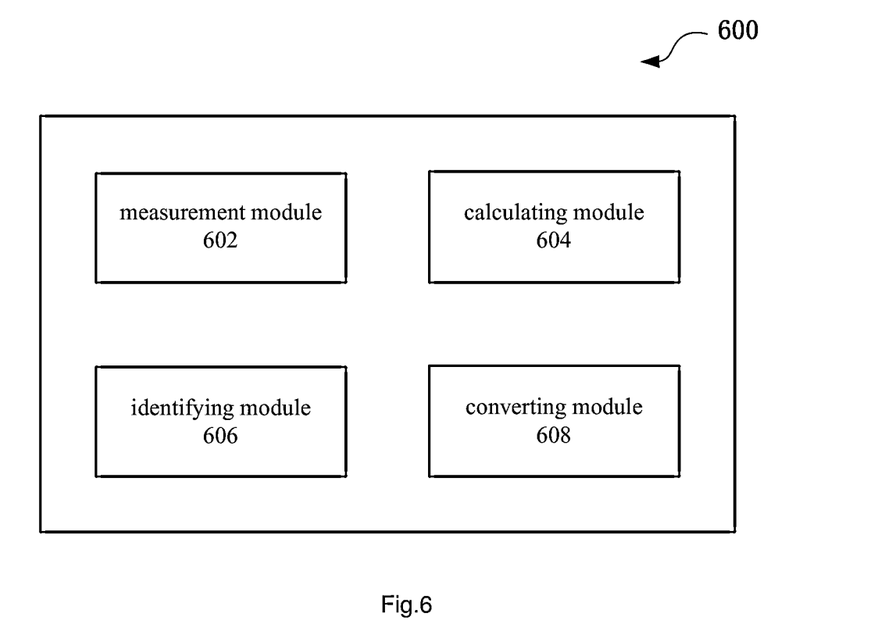
FIG. 6 illustrates a diagram of the device for identifying the fault by current differential protection according to an embodiment of the present invention.

FIG. 6 illustrates a diagram of the device for identifying the fault by current differential protection according to an embodiment of the present invention.

As shown in FIG. 6, the device 600 for identifying the fault by current differential protection mainly comprises: a measurement module 602, a calculating module 604 and an identifying module 606.

The measurement module 602 is configured to measure the full component currents of the two terminals of a two-terminal line system.

The calculating module 604 is configured to calculate the corresponding fault component current vectors; obtaining an operate value by calculating a first difference between an absolute value of the sum of the fault component current vectors and a first preset value $I_{set1}$; obtaining a restrain value by multiplying a second difference with a control factor (the control factor relates to the phase angle of the fault component currents), in which the second difference is calculated between the maximum of the absolute values of the fault component currents and a second preset value $I_{set2}$ or between the absolute value of the difference of the fault component currents and a second preset value $I_{set2}$.

The identifying module 606 is configured to identify a fault as an external one or internal one by comparing the operate value with the restrain value. In detail, the identifying module identifies a fault as an external fault or no fault in the system if operate value is smaller; otherwise, an internal fault.

When the device is applied to a multi-terminal system, the device further comprises a converting module 608, which is configured to deem the maximum and the sum as two terminals' currents of a virtual two-terminal system by selecting the maximum from the calculated fault component currents and calculating the sum of all the other calculated fault component currents except the maximum. Then the multi-terminal system can be converted into a virtual two-terminal system.

With the teaching of the proposed solution of the present invention, the skilled in the art can design or manufacture the differential current protection with better reliability, sensitivity and faster speed than existing products. What's more, the algorithm is easy to be implemented on existing platform (HW & SW). Furthermore, it does not need higher sampling frequency or more accurate measurements, which will be helpful to save development cost.

It shall be noted that the method for identifying the fault by current differential protection and device thereof provided in the present invention can be used in but not limited to the line differential protection or differential protection for main equipment, for example the generator protection, the busbar protection, the capacitor protection, the transform protection, the reactor protection, the motor protection or other protections based on current differential algorithm etc.

Referring to the description of the exemplary embodiments, those skilled in the arts appreciate the advantages of the present invention:

1, According to the method for identifying the fault by current differential protection and device thereof provided in the present invention, it has very small operate area for an external fault, which greatly improve the reliability even in the case of serious CT saturation.

2, According to the method for identifying the fault by current differential protection and device thereof provided in the present invention, it has very big operate area for internal fault, which greatly improve sensitivity for an internal fault even under heavy load and high impedance fault.

3, According to the method for identifying the fault by current differential protection and device thereof provided in the present invention, it is faster for protection relay tripping in comparison with existing differential protections based on full component currents or fault component currents.

4, According to the method for identifying the fault by current differential protection and device thereof provided in the present invention, the judgment criterion is simple and easy to adjust based on real implement, and also conveniently applied to existing platform (HW, SW, sampling freq., etc.).

Though the present invention has been described on the basis of some preferred embodiments, those skilled in the art should appreciate that those embodiments should by no means limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A method for operating a current differential relay, wherein said method comprises:
   measuring full component currents of two terminals of a two-terminal line system and calculating corresponding fault component current vectors;
   obtaining an operate value by calculating a first difference between an absolute value of a sum of said fault component current vectors and a first preset value;
   obtaining a restrain value by multiplying a second difference with a control factor, in which said control factor includes a phase angle of fault component currents, and in which said second difference is calculated between a maximum of absolute values of said fault component currents and a second preset value or between an absolute value of the difference of said fault component currents and a second preset value;
   identifying a fault as an external one or internal one by comparing said operate value with said restrain value; and
   tripping the current differential relay in response to identifying the fault as internal.

2. The method according to claim 1, wherein said control factor is a first positive value for an external fault and second positive value or negative value for an internal fault, wherein the first positive value is greater than the second positive value.

3. The method according to claim 1, wherein if the operate value is smaller than the restrain value, a fault is identified as an external fault or no fault occurs in the system; and if the operate value is larger than the restrain value, a fault is identified as an internal fault.

4. The method according to claim 1, further comprising:
   converting a multi-terminal system into a virtual two-terminal system; and
   employing the virtual two-terminal system as the two-terminal line system.

5. The method according to claim 4, further comprising:
   measuring the full component currents of all terminals of the multi-terminal line system and calculating corresponding fault component current vectors;
   selecting a maximum from the calculated fault component currents;
   calculating a sum of all the other calculated fault component current except said maximum; and
   deeming said maximum and said sum as two terminals' currents of said virtual two-terminal system.

6. The method according to claim 1, further comprising:
   directly using the full component current vectors corresponding to said fault component current vectors for identifying the fault.

7. A device for current differential protection, wherein said device comprises:
   a measurement module configured to measure full component currents of two terminals of a two-terminal line system;
   a calculating module configured to calculate corresponding fault component current vectors; obtain an operate value by calculating a first difference between an absolute value of a sum of said fault component current vectors and a first preset value; obtain a restrain value by multiplying a second difference with a control factor, in which said control factor relates to a phase angle of fault component currents, and in which said second difference is calculated between a maximum of absolute values of said fault component currents and a second preset value or between an absolute value of the difference of said fault component currents and the second preset value;

an identifying module configured to identify a fault as an external one or internal one by comparing said operate value with said restrain value; and a relay structured to trip in response to the identifying module identifying the fault as internal.

8. The device according to claim 7, wherein said control factor has a first positive value for an external fault and second positive value or negative value for an internal fault, wherein the first positive value is greater than the second positive value.

9. The device according to claim 7, wherein said identifying module identifies a fault as an external fault or no fault in the system if the operate value is smaller than the restrain value; and as an internal fault if the operate value is greater than the restrain value.

10. The device according to claim 7, wherein said device is applied to a multi-terminal system by converting said multi-terminal system into a virtual two-terminal system.

11. The device according to claim 10, wherein
said measurement module is further configured to measure full component currents of all terminals of a multi-terminal line system and calculate corresponding fault component current vectors;

said calculating module is further configured to select a maximum from the calculated fault component currents, and calculate a sum of all the other calculated fault component current except said maximum; and a converting module is configured to deem said maximum and said sum as two terminals' currents of said virtual two-terminal system.

12. The device according to claim 7, wherein said device directly uses the full component current vectors corresponding to said fault component current vectors for identifying the fault.

13. The device according to claim 11, wherein said device directly uses the full component current vectors corresponding to said fault component current vectors for identifying the fault.

14. The method according to claim 5, further comprising:
directly using the full component current vectors corresponding to said fault component current vectors for identifying the fault.

* * * * *